United States Patent
Irisawa et al.

(10) Patent No.: US 9,764,430 B2
(45) Date of Patent: Sep. 19, 2017

(54) LEAD-FREE SOLDER ALLOY, SOLDER MATERIAL AND JOINED STRUCTURE

(71) Applicant: KOKI Company Limited, Tokyo (JP)

(72) Inventors: Atsushi Irisawa, Tokyo (JP); Rie Wada, Tokyo (JP)

(73) Assignee: KOKI Company Limited, Tokyo (JP)

( * ) Notice: Subject to any disclaimer, the term of this patent is extended or adjusted under 35 U.S.C. 154(b) by 0 days.

(21) Appl. No.: 15/120,937

(22) PCT Filed: Feb. 19, 2015

(86) PCT No.: PCT/JP2015/054581
§ 371 (c)(1),
(2) Date: Aug. 23, 2016

(87) PCT Pub. No.: WO2015/125855
PCT Pub. Date: Aug. 27, 2015

(65) Prior Publication Data
US 2016/0368104 A1 Dec. 22, 2016

(30) Foreign Application Priority Data

Feb. 24, 2014 (JP) .................................. 2014-033234

(51) Int. Cl.
*H01L 23/14* (2006.01)
*B23K 35/36* (2006.01)
(Continued)

(52) U.S. Cl.
CPC ........ *B23K 35/262* (2013.01); *B23K 35/0222* (2013.01); *B23K 35/26* (2013.01); *B23K 35/36* (2013.01); *C22C 13/02* (2013.01); *H01L 24/16* (2013.01); *H05K 3/3463* (2013.01); *B23K 2201/40* (2013.01); *H01L 2224/1362* (2013.01); *H01L 2224/13611* (2013.01); *H01L 2224/13639* (2013.01); *H01L 2224/13647* (2013.01); *H01L 2224/13655* (2013.01); *H01L 2224/13657* (2013.01); *H01L 2924/014* (2013.01); *H01L 2924/01032* (2013.01)

(58) Field of Classification Search
CPC .. B23K 35/262; B23K 2201/40; B23K 35/36; H01L 24/16; H01L 2224/13611; H01L 2224/13639; H01L 2224/13647; H01L 2224/13655; H01L 2224/13657; H01L 2924/01032; H01L 2924/014
USPC ....... 257/762, 763, 764, 765, 766, 734, 737, 257/738, 777
See application file for complete search history.

(56) References Cited

U.S. PATENT DOCUMENTS 6,784,086 B2 * 8/2004 Ray .................. B23K 35/262 257/E21.511
8,847,390 B2 * 9/2014 Hashino ............ H01L 23/49866 257/737

(Continued)

FOREIGN PATENT DOCUMENTS

JP 112187 9/1935
JP 4016897 8/1965

(Continued)

Primary Examiner — Alexander Oscar Williams
(74) Attorney, Agent, or Firm — The Webb Law Firm

(57) ABSTRACT

Provided are a lead-free solder alloy which consists of Sb in an amount of more than 3.0% but 10% or less by mass, and the balance including Sn, and others.

15 Claims, 1 Drawing Sheet

(51) Int. Cl.
*B23K 35/26* (2006.01)
*B23K 35/02* (2006.01)
*C22C 13/02* (2006.01)
*H05K 3/34* (2006.01)
*H01L 23/00* (2006.01)
*B23K 101/40* (2006.01)

(56) References Cited

U.S. PATENT DOCUMENTS

| | | | |
|---|---|---|---|
| 8,944,310 B2* | 2/2015 | Matsushita | H01L 24/83 228/220 |
| 2002/0149113 A1 | 10/2002 | Ray et al. | |
| 2011/0274937 A1* | 11/2011 | Sugimori | B23K 35/262 428/457 |
| 2012/0291921 A1* | 11/2012 | Iwamura | B23K 35/3613 148/23 |
| 2012/0291922 A1* | 11/2012 | Iwamura | B23K 35/3613 148/23 |
| 2013/0164956 A1 | 6/2013 | Sakuyama et al. | |
| 2013/0186519 A1* | 7/2013 | Irisawa | B23K 35/025 148/24 |
| 2013/0327444 A1 | 12/2013 | Sawamura et al. | |
| 2014/0054766 A1 | 2/2014 | Hashino et al. | |
| 2015/0311171 A1 | 10/2015 | Sakuyama et al. | |

FOREIGN PATENT DOCUMENTS

| | | |
|---|---|---|
| JP | 527422 A | 3/1977 |
| JP | 5545316 B2 | 11/1980 |
| JP | 1177368 A | 3/1999 |
| JP | 2001244622 A | 9/2001 |
| JP | 20031483 A | 1/2003 |
| JP | 2004526309 A | 8/2004 |
| JP | 2008221330 A | 9/2008 |
| JP | 20115521 A | 1/2011 |
| JP | 2013135014 A | 7/2013 |
| JP | 2013252548 A | 12/2013 |
| JP | 201427122 A | 2/2014 |

* cited by examiner

US 9,764,430 B2

LEAD-FREE SOLDER ALLOY, SOLDER MATERIAL AND JOINED STRUCTURE

CROSS REFERENCE TO RELATED APPLICATION

This application is the United States national phase of International Application No. PCT/JP2015/054581 filed Feb. 19, 2015, and claims priority to Japanese Patent Application No. 2014-33234 filed Feb. 24, 2014, the disclosures of which are hereby incorporated in their entirety by reference.

BACKGROUND OF THE INVENTION

Field of the Invention

The present invention relates to a lead-free solder alloy which is used for soldering electronic parts; a solder material containing the same; and a joined structure containing the lead-free solder alloy.

Background Art

In recent years, a lead-free solder which contains almost no lead from the viewpoint of an environmental problem is used for mounting electronic parts on an electronic circuit substrate such as a printed wiring board.

On the other hand, the miniaturization of the parts also progresses along with a tendency of the miniaturization of a mount substrate and a wire, and as a result, the miniaturization of a solder joint portion also progresses.

Along with such a tendency of the miniaturization of the solder joint portion, such problems have occurred that a void is formed in the solder joint portion due to the occurrence of electro-migration (electromigration), and further that the wire is disconnected. Then, various technologies for suppressing the electro-migration in the lead-free solder are examined.

For instance, in Patent Literature 1, it is described to provide a protective layer formed of Ag—Sn metal on the surface of a connection terminal. However, when the protective layer is provided on the surface of the connection terminal in this way, it is necessary to change a connection structure itself, and it becomes necessary to reexamine a manufacturing process in a large extent. In addition, a process of providing the protective layer becomes necessary, and the manufacturing process becomes complicated. Then, it has been examined to adjust the composition of the solder alloy and thereby suppress the electro-migration. For instance, in Patent Literature 2, a lead-free solder alloy is described which includes Cu and In of particular contents, and the balance being Sn. In addition, in Patent Literature 3, a lead-free solder alloy is described which includes metal such as Pd, Mn, Zn, Al, Sb and In.

However, in the solder alloys described in the Patent Literatures 2 and 3, an effect of suppressing the electro-migration is insufficient.

CITATION LIST

Patent Literature

Patent Literature 1: JP 2013-135014A
Patent Literature 2: JP 2013-252548A
Patent Literature 3: JP 2014-27122A

SUMMARY OF THE INVENTION

Technical Problem

The present invention is designed with respect to the problems in a conventional technology, as have been described above, and an object of the present invention is to provide a lead-free solder alloy, a solder material and a joined structure which can sufficiently suppress the occurrence of electro-migration in a solder joint portion.

Solution to Problem

The lead-free solder alloy of the present invention consists of Sb in an amount of more than 3.0% but 10% or less by mass, and the balance including Sn.

The lead-free solder alloy of the present invention may further include at least one metal selected from the group consisting of Ag, Cu, Ni, Co and Ge, in the balance.

The lead-free solder alloy of the present invention may include the Ag in an amount of 4.0% or less by mass.

The lead-free solder alloy of the present invention may include the Cu in an amount of 1.0% or less by mass.

The lead-free solder alloy of the present invention may include the Ni, Co and Ge in a total amount of 0.1% or less by mass.

The solder material of the present invention includes the lead-free solder alloy and a flux.

The joined structure of the present invention is a joined structure in which a substrate having an electrode and a semiconductor element are joined to each other through a solder joint portion, wherein the solder joint portion includes the lead-free solder alloy.

DETAILED DESCRIPTION OF THE PREFERRED EMBODIMENT

Figure 1:
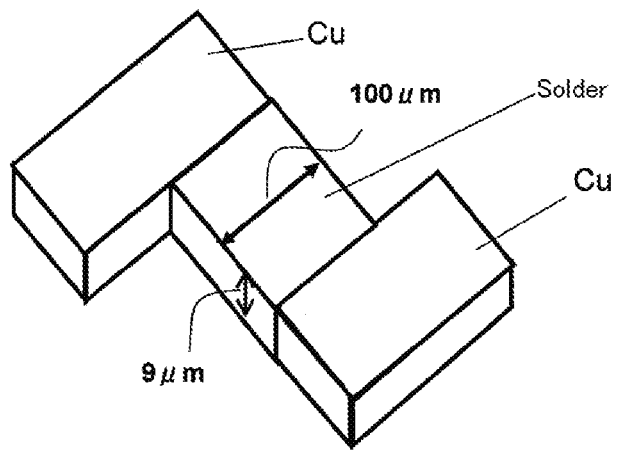
FIG. 1 is a SEM photograph showing an outline of a test piece.

The lead-free solder alloy, the solder material and the joined structure according to the present invention will be described below.

Firstly, the lead-free solder alloy of the present invention is a lead-free solder alloy which consists of Sb (antimony) in an amount of more than 3.0% but 10% or less by mass, and the balance including Sn (tin).

In the present embodiment, the balance means components other than the Sb.

The lead-free solder alloy of the present embodiment means a solder alloy which is used for a lead-free solder specified in JIS Z 3282.

The lead-free solder alloy (hereinafter referred to simply as solder alloy) of the present embodiment includes Sb in an amount of more than 3.0% but 10% or less by mass, and preferably 3.3% or more but 5% or less by mass.

The solder alloy of the present embodiment is a lead-free solder alloy which includes Sn as a main component.

Such a solder alloy which includes Sn as the main component includes Sb in the above described range, and thereby, when having been used for solder joining, can sufficiently suppress the electro-migration.

In the present embodiment, more than 3.0% by mass means the mass % which is larger than 3.0% by mass. Hereinafter, "more than" is used in the same meaning.

The electro-migration is such a phenomenon that when a high density current flows in metal, metal electrons move, and such a movement of the metal electrons results in causing a lost portion (void) in the metal portion. In particular, when the solder joint portion is miniaturized due to the miniaturization of the mount parts, a current density increases even though the electric current is small, and accordingly the electro-migration becomes easy to occur. For instance, in an extremely fine solder joint portion compared to the solder joint portion in a conventional part mounting for a printed circuit board, such as a solder joint portion like an inner bump, which electrically connects a semiconductor element with an interposer substrate, a high-density current flows in the solder joint portion, the electro-migration occurs, and a void or disconnection or the like may occur. Such electro-migration becomes easy to occur ordinarily in such a high density current as 10 kA/cm$^2$ or higher, but when the solder joint portion is a spherical bump and when the bump is a bump having a diameter of 80 μm, a high density current of 10 kA/cm$^2$ or more may flow in a current-concentration portion even when the electric current is approximately 31.4 mA. Therefore, as the solder joint portion becomes smaller, the electro-migration becomes easy to occur even at a smaller electric current.

The solder alloy of the present embodiment suppresses the electro-migration from easily occurring, and accordingly is suitably used particularly for a fine solder joint portion such as an inner bump, which electrically connects the semiconductor element with the interposer substrate.

In the solder alloy of the present embodiment, a solidus temperature which is a melting onset temperature is in a range of 220° C. to 240° C. and is preferably in a range of 230° C. to 236° C., and a liquidus temperature which is a solidification onset temperature is in a range of 221° C. to 250° C. and is preferably in a range of 230° C. to 245° C., for instance.

The solder alloy has the solidus temperature and the liquidus temperature in the above described ranges, and thereby can keep the flowability of the solder alloy in an appropriate range, while suppressing the electro-migration, and also can suppress melting at the time after solder joining.

It is generally known that the lead-free solder alloy which includes Sn as a main component has a high melting temperature because of containing no lead of which the melting temperature is lower than that of Sn. Then, the solder alloy can adjust the melting temperature by being formed into an alloy that contains a metal of which the melting temperature is lower than that of Sn. On the other hand, when the melting temperature becomes excessively low, such a problem occurs that the inner bump results in being melted when parts are mounted on a substrate which is incorporated into a mother board, for instance, in the case where the solder alloy has been used in the above described inner bump. Therefore, in the solder alloy which is used in the inner bump, the liquidus temperature is preferably, for instance, 220° C. or higher, which is the liquidus temperature of a general-purpose lead-free solder (Sn3Ag0.5Cu).

The solder alloy of the present embodiment has the melting temperature in the above described range, and thereby can keep the flowability of the solder alloy in an appropriate range, while suppressing the electro-migration, and can suppress melting at the time after solder joining.

The solder alloy of the present embodiment may further include at least one metal selected from the group consisting of Ag (silver), Cu (copper), Ni (nickel), Co (cobalt) and Ge (germanium), in addition to Sn, in the balance.

By further including these metals, the solder alloy can more suppress the electro-migration.

A preferable content of each of the metals in the balance is not limited in particular, but for instance, the content of Sn is 94.9% or more but 100% or less by mass, and is preferably 96% or more but 100% or less by mass.

In addition, the total amount of Ag, Cu, Ni, Co and Ge is 0.001% or more but 5.1% or less by mass and is preferably 0.5% or more but 4.0% or less by mass, out of the balance.

The more specific content of each of the components are, for instance, as followings.

The solder alloy of the present embodiment may include Sn in an amount of 84.4% or more but 97.0% or less by mass.

The solder alloy of the present embodiment may include Ag in an amount of 0.1% or more but 4.5% or less by mass, and preferably includes 1.0% or more but 3.5% or less by mass.

By further including Ag in the above described range, the solder alloy can more suppress the electro-migration.

When including Cu, the solder alloy of the present embodiment may include Cu in an amount of 0.1% or more but 1.2% or less by mass, and preferably may include 0.5% or more but 0.7% or less by mass.

When including Ni, the solder alloy of the present embodiment may include Ni in an amount of 0.01% or more but 0.1% or less by mass, and preferably may include 0.03% or more but 0.07% or less by mass.

When including Co, the solder alloy of the present embodiment may include Co in an amount of 0.01% or more but 0.1% or less by mass, and preferably may include 0.03% or more but 0.07% or less by mass.

When including Ge, the solder alloy of the present embodiment may include Ge in an amount of 0.001% or more but 0.1% or less by mass, and preferably may include 0.005% or more but 0.01% or less by mass.

In addition, the total content of Ni, Co and Ge may be more than 0% but 0.1% or less by mass.

In this case, the total content of Ni, Co and Ge means a total amount of at least one metal selected from the group consisting of Ni, Co and Ge, and in the case of only one metal, means the content of the one metal.

By including Cu, Ni, Co and Ge in the above described range, the solder alloy can more suppress the electro-migration.

Specifically, one example of the solder alloy of the present embodiment includes a lead-free solder alloy which consists of Sb in an amount of more than 3.0% but 10% or less by mass and the balance including Sn.

In this case, the balance is 100% Sn by mass.

In addition, another example of the solder alloy of the present embodiment includes a lead-free solder alloy which consists of Sb in an amount of more than 3.0% but 10% or less by mass, and the balance including Sn and at least one metal selected from the group consisting of Ag, Cu, Ni, Co and Ge.

In this case, the balance is Sn in an amount of 84.69% or more but 96.999% or less by mass, and the total amount of at least one metal selected from the group consisting of Ag, Cu, Ni, Co and Ge is 3.001% or more but 15.31% or less by mass.

In addition, the solder alloy of the present embodiment may also include unavoidable impurities as the balance.

In this case, one example of the solder alloy of the present embodiment is a lead-free solder alloy which consists of Sb in an amount of more than 3.0% but 10% or less by mass, and the balance consisting of Sn and the unavoidable impurities.

In addition, another example of the solder alloy of the present embodiment includes a lead-free solder alloy which consists of Sb in an amount of more than 3.0% but 10% or less by mass, and the balance consisting of Sn, the unavoidable impurities and at least one metal selected from the group consisting of Ag Cu, Ni, Co and Ge.

In the present embodiment, the content of each of the above described metal means a value which has been measured according to a method described in JIS Z 3910 with the use of a spark discharge light-emission spectroscopy.

Next, a solder material which uses the above described solder alloy of the present embodiment will be described below.

The solder material of the present embodiment is a solder material which includes the above described lead-free solder alloy and a flux.

The flux is not limited in particular, can employ a known flux, but includes, for instance, a flux which is used for a known solder material, such as a rosin-based material and a synthetic resin-based material.

The contents of the solder alloy and the flux in the solder material of the present embodiment are not limited in particular, but for instance, the content of the solder alloy is 85% or more but 95% or less by mass and is preferably 88% or more but 90% or less by mass, and the content of the flux is 5% or more but 15% or less by mass and is preferably 10% or more but 12% or less by mass.

The solder alloy which is used in the solder material of the present embodiment is preferably powdery. When being the powdery solder alloy, the solder alloy is mixed with the above described flux, and thereby can be easily formed into a pasty solder material (solder paste).

In addition, the solder alloy of the present embodiment is formed into the powder type, is mixed with the flux, and is used as the solder paste or the like, as have been described above; and besides, may be formed into various shapes such as a rod shape, a strip shape and a spherical shape, and be used.

Next, a joined structure in which the above described solder alloy and solder material of the present embodiment are used will be described below.

A solder-joined body of the present embodiment is a joined structure in which a substrate having an electrode and a semiconductor element are joined to each other through a solder joint portion, and the above described solder joint portion includes the above described lead-free solder alloy of the present embodiment.

The joined structure of the present embodiment is a joined structure in which a substrate having an electrode and a semiconductor element are joined to each other through a solder joint portion, and the above described solder joint portion includes the above described lead-free solder alloy.

The joined structure in which the substrate having the electrode and the semiconductor element are joined to each other through the solder joint portion includes, for instance, a semiconductor package which has been formed by flip chip mounting.

In the semiconductor package which has been formed by the flip chip mounting, a solder bump which has been formed on the lower surface of the semiconductor element is connected to the electrode on the substrate by solder joining, accordingly a lead wire does not need to be drawn to the side of the semiconductor element, and a fine semiconductor package can be obtained of which the size is close to the size of the semiconductor element.

On the other hand, the solder joint portion in such a joined structure results in having an extremely small size, and accordingly a high density current becomes easy to flow therein and becomes easy to cause the electro-migration.

Furthermore, the solder joint portion in such a joined structure results in being exposed to heat also when the joined structure is further mounted on a substrate which is incorporated into a mother board, and accordingly is required not to easily melt after the semiconductor element has been mounted thereon once.

In the joined structure of the present embodiment, when the solder material of the present embodiment as has been previously described is used, the solder material can sufficiently suppress the electro-migration; and at the same time, the solder material melts at an appropriate temperature when the semiconductor element is connected, and does not melt when the joined structure is mounted on the substrate.

In addition, the solder alloy of the present embodiment is used in a solder joint portion of the joined structure in which the substrate having the electrode and the semiconductor element are joined to each other through the solder joint portion, and besides, may also be used in a joined portion between ordinary electronic parts and an electrode of a printed circuit board.

The solder alloy, the solder material and the joined structure according to the present embodiments have been described above, but it should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

The lead-free solder alloy of the present invention consists of Sb in an amount of more than 3.0% but 10% or less by mass, and the balance including Sn, and accordingly, also when having been used in a solder material of a joined portion, can sufficiently suppress the electro-migration.

Therefore, the present invention can provide a lead-free solder alloy, a solder material and a joined structure which can sufficiently suppress the electro-migration in a solder joint portion.

EXAMPLES

Next, examples of the present invention will be described below together with comparative examples. The examples described below are not intended to limit the interpretation of the present invention.

(Solder Alloy)

Solder alloys having respective compositions described in Table 1 were prepared.

TABLE 1

| | | Metal composition (mass %) | | | | | | | | | Melting point | | Rupture time period |
| --- | --- | --- | --- | --- | --- | --- | --- | --- | --- | --- | --- | --- | --- |
| | Composition | Sn | Sb | Ag | Cu | In | Ni | Co | Ge | Bi | Solidus temperature | Liquidus temperature | |
| Ex. 1 | Sn5Sb | Balance | 5 | | | | | | | | 235 | 240 | 156 |
| Ex. 2 | Sn7Sb | Balance | 7 | | | | | | | | 237 | 242 | 161 |

TABLE 1-continued

|  | Composition | Metal composition (mass %) | | | | | | | | Melting point | | Rupture time period |
|---|---|---|---|---|---|---|---|---|---|---|---|---|
|  |  | Sn | Sb | Ag | Cu | In | Ni | Co | Ge | Bi | Solidus temperature | Liquidus temperature | |
| Ex. 3 | Sn9Sb | Balance | 9 | | | | | | | | 239 | 246 | 153 |
| Ex. 4 | Sn3.3Sb3.3Ag0.7Cu0.07Ni0.01Ge | Balance | 3.3 | 3.3 | 0.7 | | 0.07 | | 0.01 | | 220 | 229 | 265 |
| Ex. 5 | Sn5Sb0.05Co | Balance | 5 | | | | | 0.05 | | | 235 | 240 | 170 |
| Ex. 6 | Sn5Sb4Ag | Balance | 5 | 4 | | | | | | | 224 | 229 | 181 |
| Ex. 7 | Sn5Sb0.5Cu | Balance | 5 | | 0.5 | | | | | | 231 | 236 | 166 |
| Comp. Ex. 1 | Sn3Ag0.5Cu | Balance | | 3 | 0.5 | | | | | | 217 | 219 | 16 |
| Comp. Ex. 2 | Sn3.5Ag0.5Bi6In | Balance | | 3.5 | | 6 | | | | 0.5 | 202 | 210 | 76 |
| Comp. Ex. 3 | Sn0.7Cu8In | Balance | | | 0.7 | 8 | | | | | 204 | 212 | 36 |
| Comp. Ex. 4 | Sn0.5Sb | Balance | 0.5 | | | | | | | | 232 | 234 | 40 |
| Comp. Ex. 5 | Sn100% | 100 | | | | | | | | | 232 | 232 | 3 |

(Electro-Migration Resistance Test)

FIG. 1 shows an outline of a test piece for measuring electro-migration resistance.

TABLE 2

|  | Composition | Metal composition (mass %) | | | | | | | | | Rupture time period | | | |
|---|---|---|---|---|---|---|---|---|---|---|---|---|---|---|
|  |  | Sn | Sb | Ag | Cu | In | Ni | Co | Ge | Bi | 10 kA/cm² | 50 kA/cm² | 100 kA/cm² | 200 kA/cm² |
| Ex. 1 | Sn5Sb | Balance | 5 | | | | | | | | | 156 | 104 | 60 |
| Ex. 2 | Sn3.3Sb3.3Ag0.7Cu0.07Ni0.01Ge | Balance | 3.3 | 3.3 | 0.7 | | 0.07 | | 0.01 | | 279 | 265 | 134 | 90 |
| Comp. Ex. 3 | Sn3Ag0.5Cu | Balance | | 3 | 0.5 | | | | | | 17 | 16 | 7.4 | 0.9 |

The test piece (experimental sample piece) was manufactured by an operation of soldering each of the solder alloys between copper electrodes with the use of a soldering iron (UNIX-JBC, made by Japan Unix Co., Ltd.) having an iron tip of 200 μm. The thickness of the solder joint portion was adjusted so as to become 9 μm.

In addition, the surface of the copper electrode was polished with the use of a water-resistant abrasive paper of #2000, and then was finish-polished with the use of a water-resistant abrasive paper of #4000.

Figure 2:
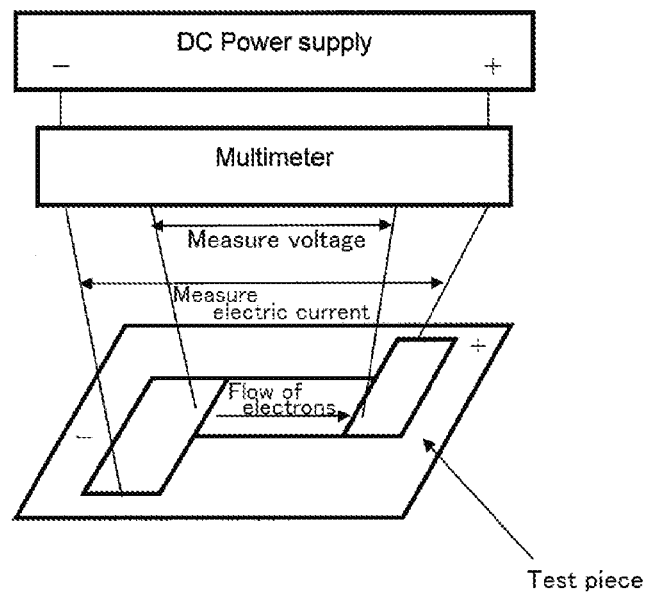
FIG. 2 is a schematic view showing an outline of a device which has been used in an electro-migration test.

The electro-migration was measured with a device shown in FIG. 2, with the use of each of the test pieces. As for the measuring method, a probe was brought into contact with the copper electrodes, an electric current was passed therethrough at an average current density of 50 kA/cm², and a voltage value was measured. The test piece was mounted on a ceramic heater, and the electric current was passed therethrough while the test piece was heated at 60° C.

The time periods in which the voltage value became incapable of being measured are shown as rupture time periods in Table 1.

In addition, an electric current was passed through each of the test pieces of Examples 1 and 4 and Comparative Example 1 at an average current density of 100 kA/cm² and 200 kA/cm², with a similar measuring method, and the voltage value was measured; and the time periods in which the voltage value became incapable of being measured are shown in Table 2 as the rupture time periods.

Furthermore, the electric current was passed through each of the test pieces of Example 4 and Comparative Example 1 at an average current density of 10 kA/cm², and the voltage value was measured; and the time periods in which the voltage value became incapable of being measured are shown in Table 2 as the rupture time periods.

(Melting Performance Test)

A melting performance of each of the solder alloys was measured.

The solidus temperature and the liquidus temperature of each of the solder alloys were measured at a temperature-raising speed of 10 K/min with differential scanning calorimetry (differential scanning calorimetry; DSC method).

The results are shown in Table 1.

As is shown in Table 1, in any example, the rupture time period was 150 hours or more, and it is clear that the occurrence of the electro-migration was suppressed.

In addition, in the examples, the solidus temperature was 230° C. or higher, and the liquidus temperature was 240° C. In other words, in the examples, the melting performance was adjusted to an appropriate range.

Furthermore, as is shown in Table 2, in Comparative Example 1, the rupture time period was short also at an average current density of 10 kA/cm², and in other words, the electro-migration occurred. On the other hand, in Examples 1 and 4, the rupture time periods were long compared to those of Comparative Example 1, at an average current density of 10 kA/cm² and also at average current densities of 50 kA/cm², 100 kA/cm² and 200 kA/cm² which are higher average current densities, and in other words, the occurrence of the electro-migration was more suppressed.

From the above description, it is clear that the occurrence of the electro-migration was surely suppressed in a wide range of the current densities in each of the examples.

The invention claimed is:

1. A lead-free solder alloy consisting of: Sb in an amount of more than 3.0% but 10% or less by mass; and the balance consisting of Sn, Ag, Cu, Ni, Ge, and unavoidable impurities.

2. The lead-free solder alloy according to claim 1, wherein the content of the Ag is 4.0% or less by mass.

3. The lead-free solder alloy according to claim 1, wherein the content of the Cu is 1.0% or less by mass.

4. The lead-free solder alloy according to claim 1, wherein the total content of the Ni, Ge, and an optional Co addition is 0.1% or less by mass.

5. A solder material comprising: the lead-free solder alloy according to claim 1; and a flux.

6. A joined structure in which a substrate having an electrode and a semiconductor element are joined to each other through a solder joint portion, wherein the solder joint portion includes the lead-free solder alloy according to claim 1.

7. The lead-free solder alloy according to claim 2, wherein the total content of the Ni, Ge, and an optional Co addition is 0.1% or less by mass.

8. The lead-free solder alloy according to claim 3, wherein the total content of the Ni, Ge, and an optional Co addition is 0.1% or less by mass.

9. A solder material comprising: the lead-free solder alloy according to claim 2; and a flux.

10. A solder material comprising: the lead-free solder alloy according to claim 3; and a flux.

11. A solder material comprising: the lead-free solder alloy according to claim 4; and a flux.

12. A joined structure in which a substrate having an electrode and a semiconductor element are joined to each other through a solder joint portion, wherein the solder joint portion includes the lead-free solder alloy according to claim 2.

13. A joined structure in which a substrate having an electrode and a semiconductor element are joined to each other through a solder joint portion, wherein the solder joint portion includes the lead-free solder alloy according to claim 3.

14. A joined structure in which a substrate having an electrode and a semiconductor element are joined to each other through a solder joint portion, wherein the solder joint portion includes the lead-free solder alloy according to claim 4.

15. A joined structure in which a substrate having an electrode and a semiconductor element are joined to each other through a solder joint portion, wherein the solder joint portion includes the lead-free solder alloy according to claim 5.

* * * * *